United States Patent
Oesterle et al.

(10) Patent No.: US 8,613,191 B2
(45) Date of Patent: Dec. 24, 2013

(54) HEAT TRANSFER ARRANGEMENT, HEAT TRANSFER DEVICE AND MANUFACTURING METHOD

(75) Inventors: Jörg Oesterle, Laichingen (DE); Anika Bürkle, Stuttgart (DE); Angela Hettel, Leinfelden-Echterdingen (DE); Ming Dong, Stuttgart (DE); Arnulf Spieth, Hochdorf (DE); Georg Wirth, Kirchheim/Teck (DE)

(73) Assignee: J. Eberspaecher GmbH & Co. KG, Esslingen (DE)

( * ) Notice: Subject to any disclaimer, the term of this patent is extended or adjusted under 35 U.S.C. 154(b) by 274 days.

(21) Appl. No.: 13/096,399

(22) Filed: Apr. 28, 2011

(65) Prior Publication Data
US 2011/0265465 A1  Nov. 3, 2011

(30) Foreign Application Priority Data

Apr. 28, 2010  (DE) .......................... 10 2010 018 478
May 20, 2010  (DE) .......................... 10 2010 022 225

(51) Int. Cl.
*F01N 3/00*  (2006.01)
(52) U.S. Cl.
USPC .................. 60/275; 60/274; 60/298; 60/320; 60/321; 165/51; 165/52; 136/205; 136/208
(58) Field of Classification Search
USPC .................. 60/274, 275, 300, 320, 321, 298; 165/51, 52; 136/205, 208
See application file for complete search history.

(56) References Cited

U.S. PATENT DOCUMENTS

| 3,035,109 | A | | 5/1962 | Sheckler |
| 5,968,456 | A | * | 10/1999 | Parise ........................... 422/174 |
| 6,119,457 | A | * | 9/2000 | Kawamura ...................... 60/618 |
| 7,467,513 | B2 | * | 12/2008 | Sasaki et al. .................... 60/320 |
| 7,921,640 | B2 | * | 4/2011 | Major ............................. 60/320 |
| 2007/0095379 | A1 | * | 5/2007 | Taher et al. .................... 136/205 |

FOREIGN PATENT DOCUMENTS

| DE | 19813241 A1 | 10/1999 |
| DE | 69720909 T2 | 2/2004 |
| DE | 60200731 T2 | 7/2005 |
| DE | 102005009480 A1 | 9/2005 |
| DE | 102006057662 A1 | 6/2008 |
| DE | 102008005694 A1 | 8/2009 |
| WO | WO 2007/026432 A1 | 3/2007 |

* cited by examiner

*Primary Examiner* — Binh Q Tran
(74) *Attorney, Agent, or Firm* — Reinhart Boerner Van Deuren P.C.

(57) ABSTRACT

The present invention relates to an arrangement for the heat transfer between a tubular body suitable for conducting a fluid and a contact body that is in contact with said tubular body, wherein the contact body comprises a contact side facing the tubular body, with which the contact body is in contact with an outside of the tubular body facing the contact body, wherein in a tensioned state of the arrangement a preload force presses the contact body against the tubular body in a preload direction.

A high heat transfer efficiency even over an operating temperature range can be achieved if the outside in an un-tensioned state of the arrangement is convexly curved towards the contact body, if the outside in the tensioned state is deformed relative to the un-tensioned state and bears against the contact side surface-to-surface, and if in the interior of the support body a support structure is arranged, which in the tensioned state supports itself on two inner sides of the tubular body located opposite each other in the preload direction.

14 Claims, 3 Drawing Sheets

HEAT TRANSFER ARRANGEMENT, HEAT TRANSFER DEVICE AND MANUFACTURING METHOD

CROSS-REFERENCE TO RELATED PATENT APPLICATIONS

This patent application claims the benefit of German Patent Application No. 10 2010 018478.0, filed Apr. 28, 2010 and German Patent Application No. 10 2010 022225.9, Filed May 20, 2010, the entire teachings and disclosure of which are incorporated herein by reference thereto.

FIELD OF THE INVENTION

The present invention relates to an arrangement for the heat transfer between a tubular body suitable for conducting a fluid and a contact body that is in contact with said tubular body. The invention additionally relates to a heat transfer device for an exhaust system of a combustion engine, more preferably of a motor vehicle, which is equipped with such a heat transfer arrangement. In addition, the invention relates to a method for manufacturing such a heat transfer arrangement.

BACKGROUND OF THE INVENTION

In many sectors of engineering it is required to achieve as effective as possible a heat transfer between a tubular body conducting a fluid and a contact body that is in contact with said tubular body. For example, heat from the fluid is to be directed into the contact body or, conversely, heat is to be transferred from the contact body into the fluid and discharged. Thus, such heat transfer arrangements are applied for cooling or for heating of a contact body by means of a fluid flow. Here, it is possible in principle, that the contact body is likewise a fluid-conducting tube so that via the arrangement heat can ultimately be transferred from the one fluid into the other fluid.

With modern applications, thermoelectric converters or thermoelectric generators are employed which convert a temperature differential into a voltage differential or a heat flow into an electric current. Such thermoelectric generators operate according to the inverted Peltier effect and thus operate analogously to Peltier elements. In a heat transfer device such thermoelectric generators can now be arranged each between a warm tube, conducting a heat-emitting fluid and a cold tube conducting a heat-absorbing fluid. The temperature differential between warm tube and cold tube is then present at the respective thermoelectric converter and can be converted into electric current.

With all these applications it is required for realising as high as possible an efficiency of the heat transfer that a surface-to-surface contact is present between the respective tubular body and the respective contact body, namely over the entire temperature range to which the arrangement is subjected during regular operation. In order to guarantee the desired surface-to-surface contacting and in order to improve the heat transfer it is possible in principle to press the tubular body and the contact body together with the help of a preload force. It has been shown however that in the case of tubular bodies bulging frequently occurs when too large a preload force is selected. Through the bulging, the tubular body can lift off the contact body in certain regions so that the previously surface-to-surface contact to the contact body becomes strip-shaped or line-shaped, which substantially impairs the heat transfer. Added to this are heat expansion effects in the case of which the respective tubular body, the respective contact body as well as preloading means for generating the preload force can expand differently, as a result of which a change of the preload force can occur so that the bulging of the tubular body for example only occurs at higher temperatures.

SUMMARY OF THE INVENTION

The present invention deals with the problem of stating an improved embodiment for a heat transfer arrangement and for a heat transfer device and for an associated manufacturing method, which is more preferably characterized by a particularly effective heat transfer.

According to the invention, this problem is solved through the subjects of the independent claims. Advantageous embodiments are the subject of the dependent claims.

The invention is based on the general idea of producing the respective tubular body so that in an un-tensioned state of the arrangement it has an outside that is convexly curved towards the contact body, which in the tensioned state deforms relative to the un-tensioned state and because of this comes to bear against the contact body in a surface-to-surface fashion. This design counteracts bulging of the tubular body and results in a high-quality surface-to-surface contacting between tubular body and contact body. In order that this high-quality contacting can also be maintained with varying preload forces the invention additionally proposes arranging a support structure in the interior of the tubular body such that the support structure in the tensioned state supports itself on two inner sides of the tubular body located opposite each other in the clamping direction. With the help of this support structure bulging of the tubular body to the inside can be effectively prevented. As a consequence, the surface-to-surface contacting between tubular body and contact body is retained even with changing preload forces. Thus, a high-quality effective heat transfer between tubular body and contact body can be achieved even for changing temperatures.

According to an advantageous embodiment a contact side of the contact body, against which the outside of the tubular body comes to bear, can be flat in the cross section of the contact body in the un-tensioned state. This is an advantage when the contact body in contrast with the tubular body has a significantly higher stiffness. This is the case for example when the contact body is a thermoelectric converter.

According to another embodiment it can be provided that the contact side and the outside in the tensioned state in the cross section of the bodies bear against each other surface-to-surface in one plane. In other words, the convexly curved outside in the tensioned state is deformed to such an extent that it comes to bear surface-to-surface against the flat contact side. On the whole, the arrangement is a comparatively compact construction as a result.

The support structure can be formed from a web material that has been folded wave-like or zig-zag-like or rectangularly or from corrugated web material. As a result, the support structure has a simple construction so that it can be realised cost-effectively. Practically an extension direction or longitudinal direction of the waves or pleats extends parallel to the longitudinal direction of the tubular body. Because of this, the support structure forms only a very small flow resistance in the tubular body.

With another embodiment the support structure can comprise at least one tube. Such a tube can have a round, more preferably circular or elliptical or oval or also an angular, more preferably square or rectangular cross section. A tubular support structure has a particularly high stability. Practically a longitudinal direction of the tube of the support structure runs parallel to the longitudinal direction of the tubular body.

For the simplified manufacture the support structure can only be fastened to one of the two inner sides of the tubular body. Thus, positioning of the support structure within the tubular body takes place on only one of the two inner sides. Because of this, the tubular body can have its curved outside in the un-tensioned state without the support structure having to be deformed as well for this purpose.

As already explained several times, the contact body can practically be a thermoelectric converter or a thermoelectric generator which converts a temperature differential into electric current.

Contacting between contact body and tubular body is effected directly or indirectly. With direct contacting the tubular body with its outside directly bears against the contact side of the contact body. With indirect contacting a further component is arranged between the outside and the contact side, which practically is a heat conductive layer. With the help of such a heat conductive layer the heat transfer between tubular body and contact body can be improved. More preferably, such a heat conductive layer can offset minor tolerance-related shape deviations between the outside and the contact side. Instead of a separate heat conductive layer which is arranged between contact side and outside, it can also be provided with another embodiment to equip the contact body on its contact side with such a heat conductive layer in such a manner that the heat conductive layer then forms a component part of the contact body or of the contact side. In addition or alternatively the tubular body or its outside can also be provided with such a heat conductive layer in such a manner that the respective heat conductive layer then forms a component part of the tubular body or of the outside. In these cases direct contacting between contact body and tubular body is present then despite heat conductive layer.

According to another embodiment the support structure can have a structured surface in such a manner that the flow resistance increases and the heat transfer is improved. In particular, with the help of a specific surface structuring, the development of turbulent boundary layers on the support structure can be supported. The support structure then has the additional function of a turbulator.

The heat transfer arrangement introduced here can more preferably be realised in a heat transfer device for an exhaust system of a combustion engine, more preferably of a motor vehicle. Such a heat transfer device comprises at least one warm tube for conducting a heat-emitting fluid, at least one cold tube for conducting a heat-absorbing fluid and at least one thermoelectric generator for converting a temperature differential into electric voltage. Here, the respective thermoelectric generator in each case is arranged between a cold tube and a warm tube and tensioned together with these. This arrangement of the respective thermoelectric generator with the respective tube in this case is configured as heat transfer arrangement according to the invention, wherein the tubular body of the heat transfer arrangement is formed through the respective tube, that is through a warm tube or through a cold tube, while the contact body of the heat transfer arrangement is formed by the respective thermoelectric generator.

The heat transfer arrangement according to the invention can for example be produced so that the support structure is introduced in the respective tubular body, that subsequently the respective tubular body is formed until its outside is convexly curved to the outside, that subsequently the respective contact body is arranged on the tubular body and that subsequently the arrangement of at least one tubular body and at least one contact body is tensioned. The forming of the tubular body only after the introduction of the support structure ensures that the support structure during the subsequent clamping can satisfy the support function when the tubular body through the clamping is again deformed. Practically, the forming of the tubular body can be realised by means of internal high-pressure forming.

Further important features and advantages of the invention are obtained from the subclaims, from the drawings and from the corresponding figure description by means of the drawings.

It is to be understood that the features mentioned above and still to be explained in the following cannot only be used in the respective combination stated, but also in other combinations or by themselves without leaving the scope of the present invention.

BRIEF DESCRIPTION OF THE DRAWINGS

Preferred exemplary embodiments of the invention are shown in the drawings and are explained in more detail in the following description, wherein same reference characters relate to same or similar or functionally same components.

It shows, in each case schematically

Figure 1:
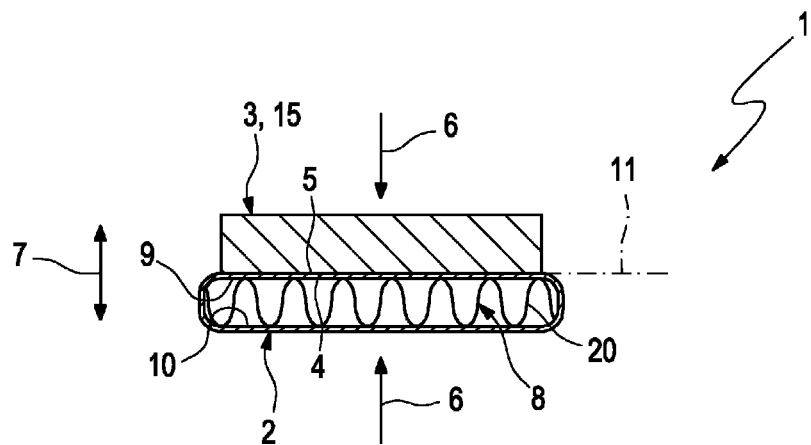
FIG. 1 is a highly simplified cross section through a heat transfer arrangement in the tensioned state.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

According to FIG. 1, an arrangement 1 for the heat transfer, which in the following is also designated heat transfer arrangement 1, comprises a tubular body 2 and a contact body 3. The tubular body 2 serves for conducting a fluid which can be a liquid or a gas. The contact body 3 is preferably a thermoelectric converter or thermoelectric generator 15. In principle, however, it can also be another component from which heat has to be discharged or which has to be supplied with heat. The arrangement 1 serves for the heat transfer between the tubular body 2 and the contact body 3, which to this end is in contact with the tubular body 2. Tubular body 2 and contact body 3 are separate components which more preferably loosely contact each other, i.e. are not fastened to each other. However, an embodiment where the tubular body 2 and the contact body 3 can be fastened to each other, e.g. through gluing, soldering, welding, is also possible.

The contact body 3 has a contact side 4 facing the tubular body 2. The tubular body 2 comprises an outside 5 facing the contact body 3. The contact body 3 with its contact side 4 is in contact with the outside 5 of the tubular body 2. In the tensioned state of the arrangement 1 shown in FIG. 1 a preload force 6 indicated by arrows is active, which presses the contact body 3 against the tubular body 2 in a preload direction 7 indicated by a double arrow. Because of this, surface-to-surface contacting is realised between contact side 4 and outside 5.

In the interior of the tubular body 2 a support structure 8 is arranged. In the tensioned state of FIG. 1, the support structure supports itself on two inner sides 9 and 10 of the tubular body 2 which are located opposite each other in the preload direction 7. Because of this, a bulge formation on the outside 5 orientated into the interior of the tubular body 2 can be hindered or prevented.

Figure 3:
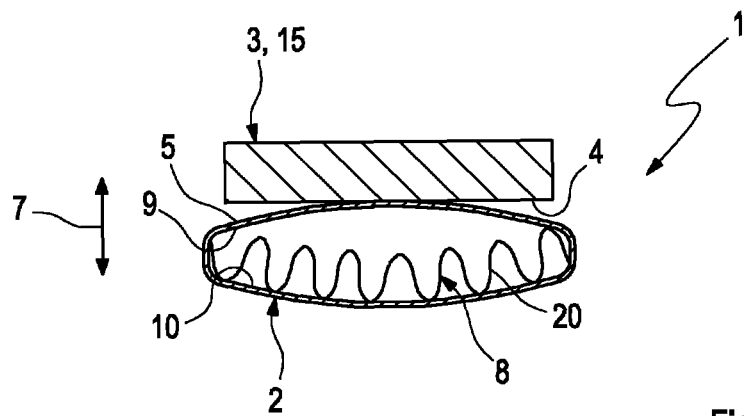
FIG. 3 is a cross section as in FIG. 1, however in the un-tensioned state.
Figure 4:
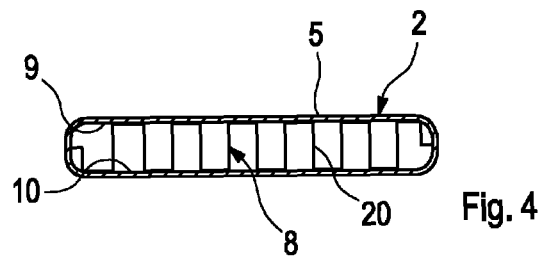
FIG. 4-7 are cross sections of a tubular body in the tensioned state with different other embodiments.

FIG. 3 shows the arrangement 1 in an un-tensioned state, with which the preload force 6 is not applied. In this un-tensioned state the outside 5 is convexly curved towards the contact body 3. In this un-tensioned state of the arrangement 1 only line-shaped or strip-shaped contacting at best can be substantially realised between outside 5 and contact side 4 at best. Accordingly, the outside 5 in the tensioned state according to FIG. 4 is noticeably deformed relative to the un-tensioned state according to FIG. 3 in such a manner that in the tensioned state according to FIG. 1 it comes to bear surface-to-surface against the contact side 4.

Through the clamping with the help of the preload force 6 the tubular body 2 is thus deformed, preferentially elastically. In contrast with this, the contact body 3 based on the preload force 6 is not deformed or only unsubstantially so. It is additionally noteworthy that the support structure 8 in the tensioned state of FIG. 1 supports the two inner sides 9, 10 on each other in the preload direction 7. In contrast with this, the support structure 8 in the un-tensioned state of FIG. 3 more or less bears against the one inner wall 10 while it is spaced from the other inner wall 9 and accordingly does not fulfil its support function.

The contact side 4 of the contact body 3 according to FIG. 3 can also be flat in the cross section of the contact body 3 in the un-tensioned state. With sufficient stiffness of the contact body 3 the flat contact side 4 in the tensioned state of FIG. 1 results in that the contact side 4 and the outside 5 in the cross section of the elements 2, 3 bear against each other surface-to-surface in a plane 11. This can be utilised for realising as compact as possible a design and a simple manufacturability.

Figure 2:
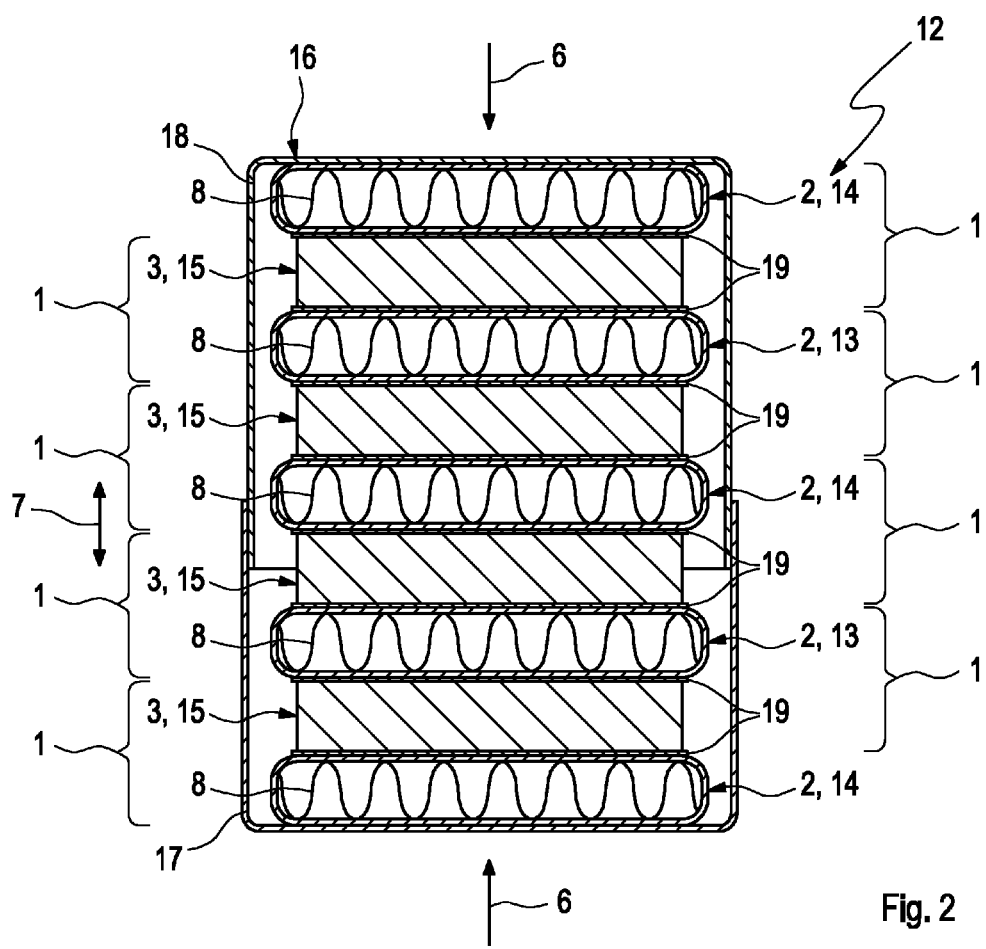
FIG. 2 is a highly simplified cross section through a heat transfer device.

According to FIG. 2 a heat transfer device 12, which can be applied with an exhaust system of a combustion engine, more preferably of a motor vehicle, comprises at least one warm tube 13 which serves for conducting a heat-emitting fluid and at least one cold tube 14, which serves for the conducting of a heat-absorbing fluid. For example, the warm tubes 13 can conduct exhaust gases which in the exhaust system are discharged from the combustion engine. In contrast with this, the cold tubes 14 can conduct coolant of a cooling circuit of the combustion engine which for example can be utilised for heating a vehicle interior space.

Furthermore, the heat transfer device 12 shown here comprises at least one thermoelectric generator 15, with the help of which a temperature differential can be converted into an electric voltage. The respective thermoelectric generator 15 in each case is arranged between a cold tube 14 and a warm tube 13 and tensioned together with these. A corresponding preload force is again indicated by arrows 6, just as the corresponding preload direction 7 is indicated by a double arrow.

In this heat transfer device 12 the respective thermoelectric generator 15 now forms a heat transfer arrangement 1 with the respective warm tube 13 and with the respective cold tube 14, which was previously explained with reference to FIGS. 1 and 3. Square brackets in FIG. 2 mark the heat transfer arrangements 1 realised. Within the respective heat transfer arrangement 1 the thermoelectric generator 15 in each case forms the contact body 3, while the respective tube, that is either the warm tube 13 or the cold tube 14, forms the associated tubular body 2 of the arrangement 1. Accordingly, a support structure 8 is likewise provided in the respective tube 13, 14.

In the shown example, three cold tubes 14 and two warm tubes 13 are provided, so that at opposite ends of the heat transfer device 12, here top and bottom, a cold tube 14 each is present. This is an advantage with respect to the energy transfer to the electrothermal generators 15. In principle, each warm tube 13 and each cold tube 14 can form a deformed tubular body 2 of the arrangement. However, another embodiment where only the cold tubes 14 are configured as deformed tubular body 2 of the arrangement 1 is also possible, while the warm tubes 13 are substantially un-deformed in the tensioned state. Alternatively it is likewise possible to configure only the warm tubes 13 as deformed tubular bodies 2 of the arrangement 1 while the cold tubes 14 are substantially un-deformed also in the tensioned state.

To realise the clamping or for introducing the preload force 6 the heat transfer device 12 comprises a housing 16, which for example has two housing halves 17 and 18 which are U-shaped in profile, which are inserted into each other in the preload direction 7 so that for example the preload force 6 can be applied to the housing halves 17, 18 for example by means of a clamping strap or a welded connection or a screw connection or the like, and via these to the arrangements 1. It is clear that in this case any other suitable profiles or shapes such as for example C-shaped, I-shaped, L-shaped and T-shaped can be used in principle for the housing halves 17, 18 for as long as the respective housing 16 can realise the desired internal preload or clamping for generating the preload force 6.

The arrangements 1, which are used in the heat transfer device 12 of FIG. 2, are additionally characterized in that between the respective tubes 13, 14 or the tubular body 2 and the respective thermoelectric generator 15 or the contact body 3 a heat conductive layer 19 is arranged. Thus, contact body 3 and tubular body 2 in this case do not bear against each other directly, but indirectly, namely via the respective heat conductive layer 19.

In general, with all arrangements 1, such a heat conductive layer 19 can be arranged between the contact side 4 and the outside 5. In this case the heat conductive layer 19 can then be arranged as separate component between contact body 3 and tubular body 2. It is likewise possible to apply the heat conductive layer 19 as component part of the tubular body 2 on its outside 5. In addition or alternatively such a heat conductive layer 19 can be applied to its contact side 4 as component part of the contact body 3. Insofar as the heat conductive layer 19 then forms a component part of the contact body 3 or of the contact side 5 or forms a component part of the tubular body 2 or of the outside 5, contacting between tubular body 2 and contact body 3 is again effected directly.

Insofar as the respective heat conductive layer 19 is realised as separate element or component it can be produced or consist of a carbon film or of a graphite film which for example is based on mica. The respective heat conductive layer 19 can also be silicon-based. Alternatively, heat conductive layers 19 of kapton films or aramide fabrics are also conceivable. Any material with comparatively high heat conductivity is suitable in principle for producing such a heat conductive layer 19. Preferably, the respective material of the heat conductive layer 19 should have a comparatively high flexibility, for example in order to be able to offset manufacturing tolerances, which improves the surface-to-surface contact and accordingly the heat transfer.

Figure 6:
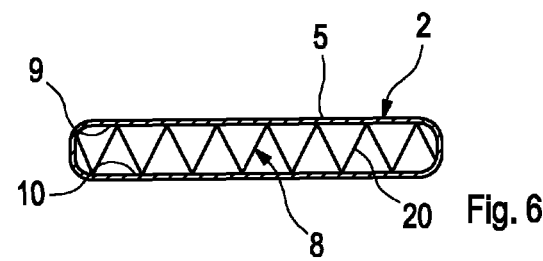
Figure 7:
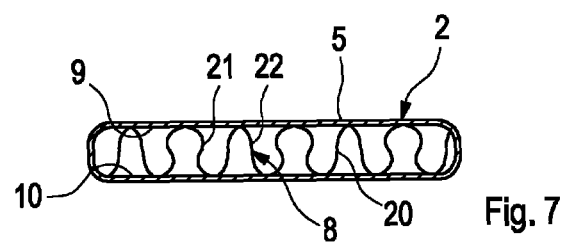

The support structure 8 is practically produced from a web material 20 which with the embodiments of FIG. 1-3 can for example be folded wave-like or corrugated. In principle, however, quasi any folded or corrugated configurations are conceivable here. For example, FIG. 4 shows a rectangularly folded web material 20, while FIG. 6 shows a zig-zag-shaped folded web material 20. FIG. 7 shows a complex wave shape, wherein within the web material 20 omega-shaped portions 21 and sinusoidal portions 22 regularly alternate or follow one another in any sequence. Such a mixed shaping can be of special advantage since in this manner with the sinusoidal portions 22 the support structure 8 is stiffened through the compression on the one hand while the support structure with the omega-shaped portions 21 on the other hand can more elastically absorb the compression. Through a specific selection and sequence of the sinusoidal and omega-shaped portions 21, 22 a desired stiffening and supporting effect in the support structure 8 can be realised.

The individual waves or pleats of the web material 20 in this case extend with their extension direction or longitudinal direction parallel to the longitudinal direction of the tubular body 2. Said longitudinal direction in the cross sections stands perpendicularly on the drawing plane.

Figure 5:
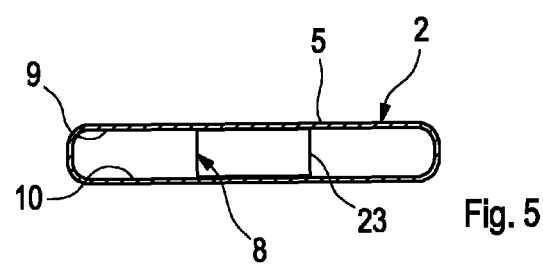

FIG. 5 shows another embodiment of the support structure 8, with which it comprises at least one tube 23 or is formed through one tube 23. Practically, a longitudinal direction of the tube 23 in this case also runs parallel to the longitudinal direction of the tubular body 2.

The support structure 8 can have a structured surface in such a manner that the flow resistance increases and the heat transfer is improved. More preferably, with the help of a specific surface structure, the development of turbulent boundary layers can be supported. The support structure 8 then has the additional function of a turbulator.

In the following, a preferred method for producing the heat transfer arrangement 1 or the heat transfer device 12 is explained in more detail making reference to FIG. 8a-8e.

Initially, according to FIG. 8a, a blank for the tubular body 2 is provided, which in FIG. 8a is designated 2'. According to FIG. 8b the support structure 8 is introduced into this blank 2'. There it is possible in principle to fasten the support structure 8 on the tubular body 2 or on the blank 2'. Preferably the support structure 8 in this case is only fastened to one of the two inner sides 9, 10, for example by means of a soldering process. For example, the support structure 8 is only fastened to the inside 10. Alternatively to this, the support structure 8 can also be fastened to both inner sides 9, 10.

Figure 8:
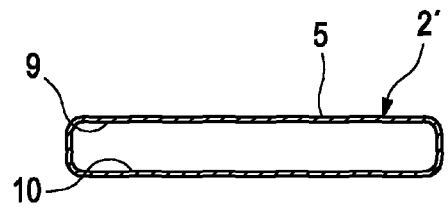
FIG. 8 is a heat transfer arrangement with different states a toe of its manufacture.
Figure 8:
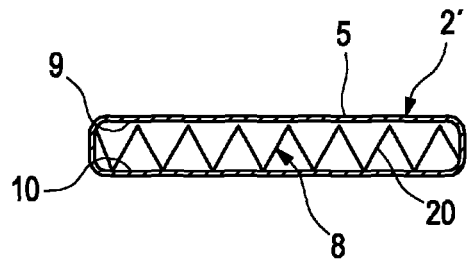
Figure 8:
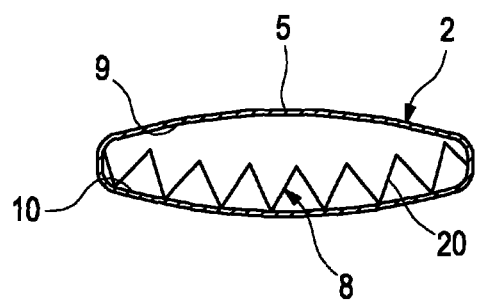
Figure 8:
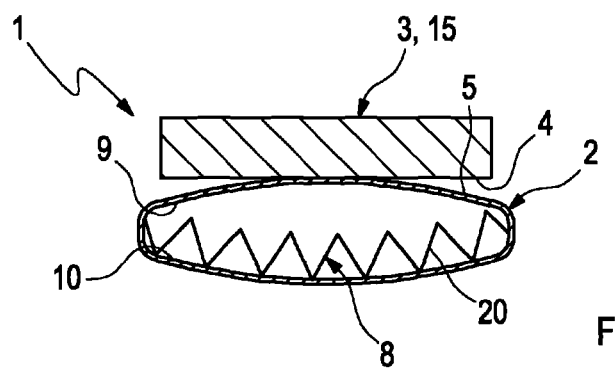
Figure 8:
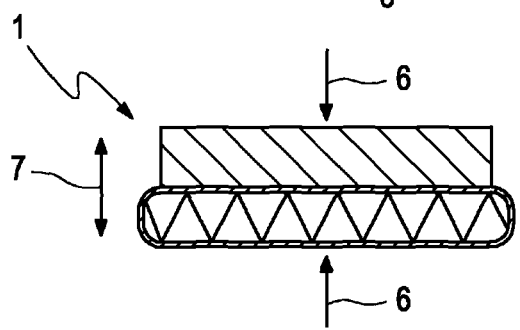

According to FIG. 8c forming of the tubular body 2 or of the blank 2' then takes place in such a manner until the outside 5 is convexly curved to the outside. The tubular body 2 has now reached its end shape in the un-tensioned state. Insofar as the support structure 8 is only fastened to the one inner side 10, the other inner side 9 during this forming process lifts off the support structure 8. Insofar as the support structure 8 is fastened to both inner sides 9, 10 a plastic deformation of the support structure 8 also occurs during the forming process. The sectional views of FIG. 1 to 8 each show a cross section of the tubular body 2 transversely to its longitudinal direction. The convex curvature shown in FIGS. 3 and 8c in this case is realised in these cross sections, that is occurs in the transverse direction of the tubular body 2. The tubular body 2 can likewise be curved in its longitudinal direction so that the convex curvature is then realised in the longitudinal section. Thus, two vertically superimposing curvatures can be present which results in a spatial or spherical curvature. As a result of this a varying cross section with varying curvature radii is obtained for the tubular body 2 in the longitudinal direction of the tubular body 2.

According to FIG. 8b the contact body 3 can now be arranged on the tubular body 2. This then corresponds to the un-tensioned state of the arrangement 1 according to FIG. 3.

Following this, clamping of the arrangement 1 with the preload force 6 in the preload direction 7 takes place, which results in the tensioned state of the arrangement 1 reflected in FIG. 8e, which also corresponds to the state of FIG. 1.

The forming of the tubular body 2 or of the blank 2' in this case can for example be realised by means of an internal high-pressure forming method.

For producing the heat transfer device 12 the tubular bodies 2 or the tubes 13, 14 and the contact bodies 3 or the thermoelectric generators 15 are stacked on top of one another and subsequently in the stack, tensioned with or without housing 16.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An arrangement for the heat transfer between a tubular body suitable for conducting a fluid and a contact body that is in contact with said tubular body, wherein the contact body comprises a contact side facing the tubular body, with which the contact body with an outside facing the contact body is in contact with the tubular body, wherein in a tensioned state of the arrangement a preload force presses the contact body against the tubular body in a preload direction, wherein the outside in an un-tensioned state of the arrangement is convexly curved towards the contact body, wherein the outside in the tensioned state is deformed relative to the un-tensioned state and bears surface-to-surface against the contact side, wherein in the interior of the tubular body a support structure is arranged, which in the tensioned state supports itself on two inner sides of the tubular body located opposite each other in the preload direction.

2. The arrangement according to claim 1, wherein the contact side in the un-tensioned state is flat in the cross section of the contact body.

3. The arrangement according to claim 1, wherein the contact side and the outside in the tensioned state in the cross section of the body bear against each other surface-to-surface in one plane.

4. The arrangement according to claim 1, wherein the support structure is formed of a more preferably wave-shaped or zig-zag-shaped or rectangularly folded or corrugated web material.

5. The arrangement according to claim 1, wherein an extension direction or longitudinal direction of the waves or pleats extends parallel to the longitudinal direction of the tubular body.

6. The arrangement according to claim 1, wherein the support structure comprises at least one tube or is formed by such.

7. The arrangement according to claim 1, wherein a longitudinal direction of the tube runs parallel to the longitudinal direction of the tubular body.

8. The arrangement according to claim 1, wherein the support structure is only fastened to one of the two inner sides.

9. The arrangement according to claim 1, wherein the contact body is a thermoelectric generator.

10. The arrangement according to claim 1, wherein between the contact side and the outside a heat conductive layer is arranged.

11. The arrangement according to claim 1, wherein at least one of the contact side and the outside comprises a heat conductive layer.

12. A heat transfer device for an exhaust system of a combustion engine, more preferably of a motor vehicle, with at least one warm tube for conducting a heat-emitting fluid, with at least one cold tube for conducting a heat-absorbing fluid, with at least one thermoelectric generator for converting a temperature differential into electric voltage, wherein the respective thermoelectric generator in each case is arranged between a cold tube and a warm tube and tensioned together with these, wherein the respective thermoelectric generator is configured with at least one such tube as an arrangement for the heat transfer between a tubular body suitable for conducting a fluid and a contact body that is in contact with said tubular body, wherein the contact body comprises a contact side facing the tubular body, with which the contact body with an outside facing the contact body is in contact with the tubular body, wherein in a tensioned state of the arrangement a preload force presses the contact body against the tubular body in a preload direction, wherein the outside in an un-tensioned state of the arrangement is convexly curved towards the contact body, wherein the outside in the tensioned state is deformed relative to the un-tensioned state and bears surface-to-surface against the contact side, wherein in the interior of the tubular body a support structure is arranged, which in the tensioned state supports itself on two inner sides of the tubular body located opposite each other in the preload direction, wherein the tubular body of the arrangement is formed through the respective tube and the contact body of the arrangement is formed by the respective thermoelectric generator.

13. A method for producing an arrangement for the heat transfer between a tubular body suitable for conducting a fluid and a contact body that is in contact with said tubular body, wherein the contact body comprises a contact side facing the tubular body, with which the contact body with an outside facing the contact body is in contact with the tubular body, wherein in a tensioned state of the arrangement a preload force presses the contact body against the tubular body in a preload direction, wherein the outside in an un-tensioned state of the arrangement is convexly curved towards the contact body, wherein the outside in the tensioned state is deformed relative to the un-tensioned state and bears surface-to-surface against the contact side, wherein in the interior of the tubular body a support structure is arranged, which in the tensioned state supports itself on two inner sides of the tubular body located opposite each other in the preload direction, wherein the support structure is introduced in the respective tubular body, wherein the respective tubular body is subsequently formed until its outside is convexly curved to the outside, wherein subsequently the respective contact body is arranged on the tubular body, wherein subsequently the arrangement of at least one tubular body and at least one contact body is tensioned together.

14. The method according to claim 13, wherein the forming of the respective tubular body is effected by means of internal high-pressure forming.

* * * * *